United States Patent
Chen et al.

(10) Patent No.: US 10,411,098 B2
(45) Date of Patent: Sep. 10, 2019

(54) SEMICONDUCTOR DEVICE AND MANUFACTURING METHOD THEREOF

(71) Applicant: Nuvoton Technology Corporation, Hsinchu (TW)

(72) Inventors: Chih-Wei Chen, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/990,689

(22) Filed: May 28, 2018

(65) Prior Publication Data
US 2019/0035896 A1   Jan. 31, 2019

(30) Foreign Application Priority Data
Jul. 28, 2017   (TW) .............................. 106125439 A

(51) Int. Cl.
*H01L 29/20* (2006.01)
*H01L 29/10* (2006.01)
(Continued)

(52) U.S. Cl.
CPC ...... *H01L 29/2003* (2013.01); *H01L 21/0254* (2013.01); *H01L 21/8252* (2013.01);
(Continued)

(58) Field of Classification Search
CPC .................................................. H01L 29/2003
See application file for complete search history.

(56) References Cited

U.S. PATENT DOCUMENTS 5,744,372 A * 4/1998 Bulucea .......... H01L 21/823807
257/E21.427
6,005,266 A * 12/1999 Forrest .................. H01L 29/808
257/256
(Continued)

FOREIGN PATENT DOCUMENTS

CN    101728251    6/2010
TW    201236153    9/2012
(Continued)

OTHER PUBLICATIONS

"Office Action of Taiwan Counterpart Application," dated Jan. 29, 2019, p. 1-p. 6.

*Primary Examiner* — William A Harriston
(74) *Attorney, Agent, or Firm* — JCIPRNET

(57) ABSTRACT

A semiconductor device and a manufacturing method thereof are provided. The semiconductor device includes a first stacked structure, a second stacked structure, an isolation layer and a gate. The first stacked structure is disposed on a substrate, and includes a first GaN channel layer disposed on the substrate and having an N crystal phase and a first barrier layer disposed on the first GaN channel layer. The second stacked structure is disposed on the substrate, and includes a second GaN channel layer disposed on the substrate and having a Ga crystal phase and a second barrier layer disposed on the second GaN channel layer. The isolation layer is disposed between the first stacked structure and the second stacked structure. The gate is disposed on the first stacked structure, the isolation layer and the second stacked structure.

13 Claims, 3 Drawing Sheets

10

(51) Int. Cl.
  *H01L 29/06* (2006.01)
  *H01L 29/66* (2006.01)
  *H01L 29/778* (2006.01)
  *H01L 27/06* (2006.01)
  *H01L 29/04* (2006.01)
  *H01L 27/092* (2006.01)
  *H01L 21/8238* (2006.01)
  *H01L 21/02* (2006.01)
  *H01L 21/8252* (2006.01)

(52) U.S. Cl.
  CPC ........ *H01L 27/0605* (2013.01); *H01L 27/092* (2013.01); *H01L 29/045* (2013.01); *H01L 29/0642* (2013.01); *H01L 29/1025* (2013.01); *H01L 29/66446* (2013.01); *H01L 29/66462* (2013.01); *H01L 29/7786* (2013.01); *H01L 21/823807* (2013.01)

(56) References Cited

U.S. PATENT DOCUMENTS

| | | | | |
|---|---|---|---|---|
| 6,037,617 A * | 3/2000 | Kumagai | ............ | H01L 27/1203 257/262 |
| 6,190,975 B1 * | 2/2001 | Kubo | ............ | H01L 21/8238 257/E21.403 |
| 7,005,694 B2 * | 2/2006 | Amo | ............ | G11C 15/043 257/296 |
| 7,838,908 B2 * | 11/2010 | Kwon | ............ | H01L 21/823807 257/204 |
| 8,946,779 B2 * | 2/2015 | Green | ............ | H01L 27/0629 257/195 |
| 9,559,012 B1 * | 1/2017 | Chu | ............ | H01L 29/2003 |
| 2004/0191974 A1 * | 9/2004 | Gilmer | ............ | H01L 21/823842 438/199 |
| 2005/0179096 A1 * | 8/2005 | Beach | ............ | H01L 27/0605 257/401 |
| 2010/0187610 A1 * | 7/2010 | Kwon | ............ | H01L 21/823807 257/369 |
| 2012/0112188 A1 * | 5/2012 | Yokoyama | ............ | H01L 21/0242 257/51 |
| 2014/0167113 A1 | 6/2014 | Lee et al. | | |
| 2014/0361371 A1 * | 12/2014 | Comeau | ............ | H01L 27/1203 257/351 |
| 2015/0024601 A1 * | 1/2015 | Zhou | ............ | H01L 21/02381 438/700 |
| 2015/0221649 A1 | 8/2015 | Kub et al. | | |
| 2016/0043219 A1 | 2/2016 | Liu et al. | | |

FOREIGN PATENT DOCUMENTS

| | | |
|---|---|---|
| TW | 201513364 | 4/2015 |
| TW | 201705445 | 2/2017 |
| TW | I572036 | 2/2017 |
| TW | 201721865 | 6/2017 |

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 106125439, filed on Jul. 28, 2017. The entirety of the above-mentioned patent application is hereby incorporated by reference herein and made a part of this specification.

BACKGROUND OF THE INVENTION

Field of the Invention

The invention relates to a semiconductor device, and particularly relates to a semiconductor device having an N-type channel and a P-type channel.

Description of Related Art

Since a GaN type semiconductor device has advantages of high electron mobility, high voltage tolerance, low channel resistance and fast switching, etc., it has gradually been widely applied. In the GaN type semiconductor device (for example, a complementary metal oxide semiconductor (CMOS)) having an N-type channel and a P-type channel, ion implantation is generally adopted to respectively implant N-type dopant and P-type dopant into different channel layers to form an N-type channel and a P-type channel.

However, when the ion implantation is performed, it is required to accurately implant the dopant to a predetermined region, so that process difficulty is relatively high, and process steps are relatively complicated. Moreover, after the N-type dopant and the P-type dopant are implanted, the N-type dopant and the P-type dopant usually have a diffusion phenomenon in a subsequent high-temperature process, which influences a device performance.

SUMMARY OF THE INVENTION

The invention is directed to a semiconductor device, which has an N-type channel and a P-type channel.

The invention is directed to a method for manufacturing a semiconductor device, which is configured to manufacture a semiconductor device having an N-type channel and a P-type channel.

The invention provides a semiconductor device including a first stacked structure, a second stacked structure, an isolation layer and a gate. The first stacked structure is disposed on a substrate, and includes a first GaN channel layer disposed on the substrate and having an N crystal phase and a first barrier layer disposed on the first GaN channel layer. The second stacked structure is disposed on the substrate, and includes a second GaN channel layer disposed on the substrate and having a Ga crystal phase and a second barrier layer disposed on the second GaN channel layer. The isolation layer is disposed between the first stacked structure and the second stacked structure, wherein the first stacked structure is isolated from the second stacked structure by the isolation layer. The gate is disposed on the first stacked structure, the isolation layer and the second stacked structure.

In an embodiment of the invention, a thickness of the first GaN channel layer and a thickness of the second GaN channel layer are substantially the same, and a thickness of the first barrier layer and a thickness of the second barrier layer are substantially the same.

In an embodiment of the invention, the semiconductor device further includes a first passivation layer and a second passivation layer, wherein the first passivation layer is disposed on the first barrier layer and the second passivation layer is disposed on the second barrier layer.

In an embodiment of the invention, a thickness of the first GaN channel layer and a thickness of the second GaN channel layer are substantially the same, a thickness of the first barrier layer and a thickness of the second barrier layer are substantially the same, and a thickness of the first passivation layer and a thickness of the second passivation layer are substantially the same.

In an embodiment of the invention, the semiconductor device further includes a first buffer layer and a second buffer layer, where the first buffer layer is disposed between the first GaN channel layer and the substrate, and the second buffer layer is disposed between the second GaN channel layer and the substrate.

In an embodiment of the invention, a thickness of the first GaN channel layer and a thickness of the second GaN channel layer are substantially the same, a thickness of the first barrier layer and a thickness of the second barrier layer are substantially the same, and a thickness of the first buffer layer and a thickness of the second buffer layer are substantially the same.

The invention provides a semiconductor device including a first stacked structure, a second stacked structure, an isolation layer and a gate. The first stacked structure is disposed on a substrate, and includes a first GaN channel layer disposed on the substrate and belonging to an P-type channel layer and a first barrier layer disposed on the first GaN channel layer. The second stacked structure is disposed on the substrate, and includes a second GaN channel layer disposed on the substrate and belonging to an N-type channel layer and a second barrier layer disposed on the second GaN channel layer. The isolation layer is disposed between the first stacked structure and the second stacked structure, wherein the first stacked structure is isolated from the second stacked structure by the isolation layer. The gate is disposed on the first stacked structure, the isolation layer and the second stacked structure.

The invention provides a method for manufacturing a semiconductor device including: performing a first deposition process to form a first GaN channel layer on a substrate, where the first GaN channel layer has an N crystal phase; forming a first barrier layer on the first GaN channel layer; removing a part of the first barrier layer and the first GaN channel layer to form a first stacked structure; performing a second deposition process to form a second GaN channel layer on the substrate, where the second GaN channel layer has a Ga crystal phase; forming a second barrier layer on the second GaN channel layer to form a second stacked structure, where the first stacked structure and the second stacked structure are separated; forming an isolation layer between the first stacked structure and the second stacked structure, wherein the first stacked structure is isolated from the second stacked structure by the isolation layer; and forming a gate on the first stacked structure, the isolation layer and the second stacked structure.

In an embodiment of the invention, the first deposition process is different from the second deposition process.

In an embodiment of the invention, a thickness of the first GaN channel layer and a thickness of the second GaN channel layer are substantially the same, and a thickness of the first barrier layer and a thickness of the second barrier layer are substantially the same.

In an embodiment of the invention, after the step of forming the first barrier layer and before the step of removing a part of the first barrier layer and the first GaN channel layer, the method further includes: forming a first passivation layer on the first barrier layer, and after the step of forming the second barrier layer and before the step of forming the isolation layer, the method further includes: forming a second passivation layer on the second barrier layer.

In an embodiment of the invention, a thickness of the first GaN channel layer and a thickness of the second GaN channel layer are substantially the same, a thickness of the first barrier layer and a thickness of the second barrier layer are substantially the same, and a thickness of the first passivation layer and a thickness of the second passivation layer are substantially the same.

In an embodiment of the invention, before the step of performing the first deposition process, the method further includes: forming a first buffer layer on the substrate, and after the step of forming the first stacked structure and before the step of performing the second deposition process, the method further includes: forming a second buffer layer on the substrate.

In an embodiment of the invention, a thickness of the first GaN channel layer and a thickness of the second GaN channel layer are substantially the same, a thickness of the first barrier layer and a thickness of the second barrier layer are substantially the same, and a thickness of the first buffer layer and a thickness of the second buffer layer are substantially the same.

In an embodiment of the invention, after the step of forming the first stacked structure and before the step of performing the second deposition process, the method further includes: forming a mask layer on the substrate to cover the first stacked structure, and after the step of forming the second stacked structure and forming the isolation layer, the method further includes: removing the mask layer.

According to the above description, in the invention, the P-type channel layer and the N-type channel layer are formed by using the deposition process other than using the ion implantation, so that the process steps are relatively simple, and process difficulty and manufacturing cost are decreased. Moreover, in the invention, by adjusting a process parameter, a P-type metal oxide semiconductor transistor and an N-type metal oxide semiconductor transistor with substantially the same structure are formed on the substrate, so that process unstableness caused by uneven pattern flatness is avoided in subsequent process, and it is unnecessary to perform an extra planarization process (for example, a chemical mechanical polishing process).

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
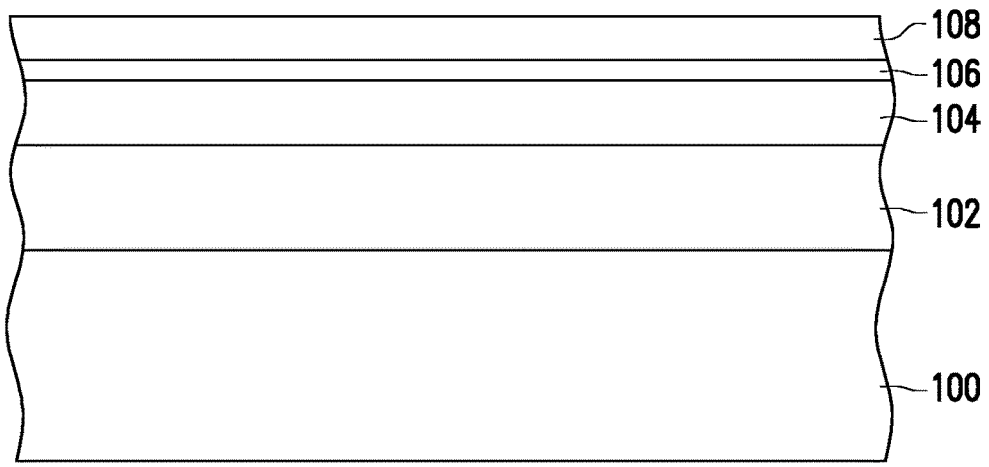
FIG. 1A to FIG. 1D are cross-sectional views of a semiconductor device according to an embodiment of the invention.

FIG. 1A to FIG. 1D are cross-sectional views of a semiconductor device according to an embodiment of the invention. Referring to FIG. 1A, a substrate 100 is provided. The substrate 100 is, for example, a silicon substrate, an SiC substrate, a sapphire substrate, or a GaN substrate. Then, a buffer layer 102 is optionally formed on the substrate 100. A material of the buffer layer 102 is, for example, GaN, AlGaN or AlN. Moreover, the buffer layer 102 may be doped with C or Fe to increase a resistance value. A method for forming the buffer layer 102 is, for example, to perform an epitaxial growth process. A thickness of the buffer layer 102 is, for example, between 1 μm and 4 μm. Then, a GaN channel layer 104 is formed on the buffer layer 102. A method for forming the GaN channel layer 104 is, for example, to perform metal organic chemical vapor deposition (MOCVD), molecular beam epitaxy (MBE) deposition, etc. In the present embodiment, the aforementioned deposition process makes the formed GaN channel layer 104 to have an N crystal phase. In other words, the formed GaN channel layer 104 belongs to a P-type channel layer due to that it has the N crystal phase.

Then, a barrier layer 106 is formed on the GaN channel layer 104. A material of the barrier layer 106 is, for example, a ternary group III metal nitride or a quaternary group III metal nitride. The ternary group III metal nitride is, for example, AlInN, InGaN or AlGaN. The quaternary group III metal nitride is, for example, AlInGaN. A method for forming the barrier layer 106 is, for example, to perform an epitaxial growth process. A thickness of the barrier layer 106 is, for example, between 5 nm and 80 nm. Then, a passivation layer 108 is optionally formed on the barrier layer 106. A material of the passivation layer 108 is, for example, GaN. A method for forming the passivation layer 108 is, for example, to perform the epitaxial growth process. A thickness of the passivation layer 108 is, for example, between 1 nm and 50 nm.

Figure 1B:
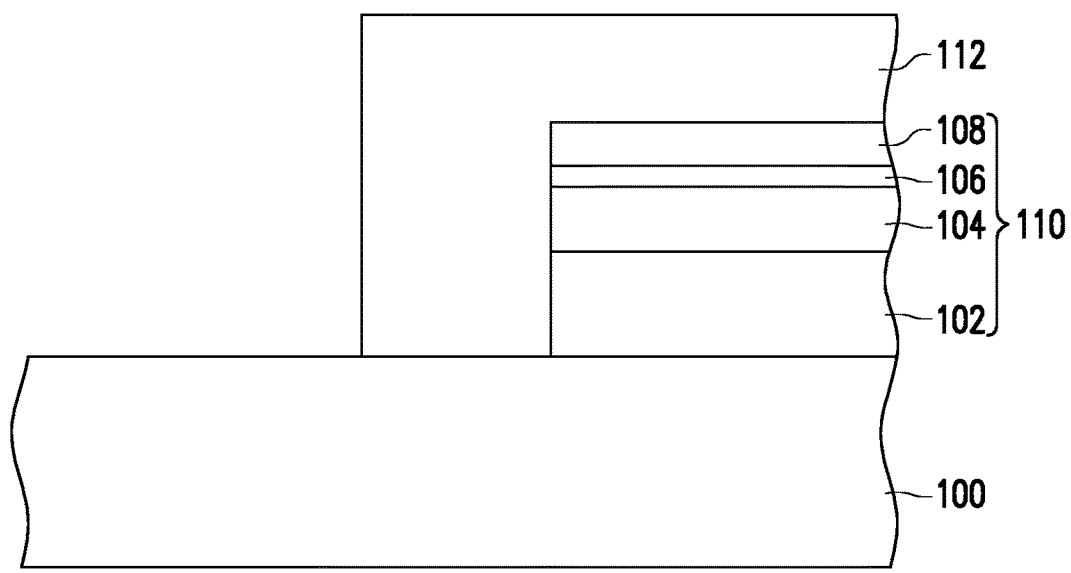

Then, referring to FIG. 1B, a patterning process is performed to remove a part of passivation layer 108, a part of the barrier layer 106, a part of the GaN channel layer 104 and a part of the buffer layer 102. The remained buffer layer 102, the GaN channel layer 104, the barrier layer 106 and the passivation layer 108 form a stacked structure 110. In the aforementioned patterning process, a dry etching process is, for example, adopted to remove a part of the passivation layer 108, a part of the barrier layer 106, a part of the GaN channel layer 104 and a part of the buffer layer 102. Then, a mask layer 112 is formed on the substrate 100. The mask layer 112 covers the whole stacked structure 110 and a part of the substrate 100, and exposes a region of another stacked structure subsequently formed on the substrate 100.

Figure 1C:
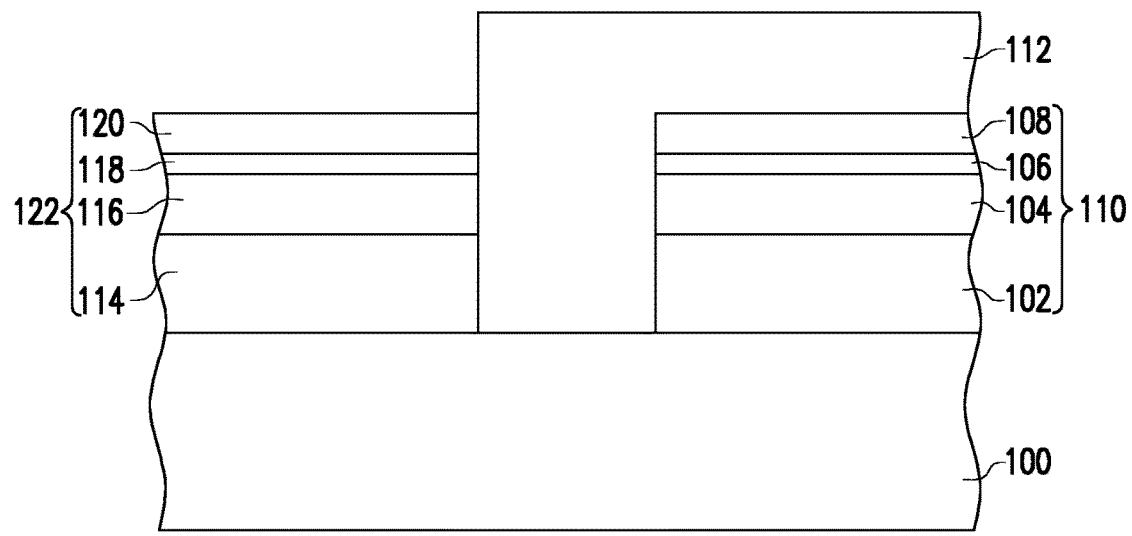

Then, referring to FIG. 1C, a buffer layer 114 is formed on the substrate 100 that is not covered by the mask layer 112. A material of the buffer layer 114 and a method for forming the same may be the same with that of the buffer layer 102. Then, a GaN channel layer 116 is formed on the buffer layer 114. A method for forming the GaN channel layer 116 is, for example, to perform the MOCVD, MBE deposition, etc. In the present embodiment, the aforementioned deposition process makes the formed GaN channel layer 116 to have a Ga crystal phase. In other words, the formed GaN channel layer 116 belongs to an N-type channel layer due to that it has the Ga crystal phase.

It should be noted that in the present embodiment, the deposition process used for forming the GaN channel layer 104 and the deposition process used for forming the GaN channel layer 116 are different, so that the formed channel layers belong to channel layers of opposite types. Moreover, in the present embodiment, the deposition processes are adopted to form the P-type channel layer and the N-type channel layer other than using the ion implantation to form the channel layers of opposite types, which effectively simplifies the process steps and the process difficulty, and also reduces the manufacturing cost. Moreover, in the present embodiment, the buffer layer 114 (or the GaN channel layer 116 in case that the buffer layer 114 is not applied) is formed on the substrate 100 with a flat surface by using the deposition process, such that the buffer layer 114 (or the GaN channel layer 116 in case that the buffer layer 114 is not applied) and the film layers subsequently formed thereon are ensured to have good quality.

Then, a barrier layer 118 is formed on the GaN channel layer 116. A material of the barrier layer 118 and a method for forming the same may be the same with that of the barrier layer 106. Then, a passivation layer 120 is optionally formed on the barrier layer 118. A material of the passivation layer 120 and a method for forming the same may be the same with that of the passivation layer 108. The buffer layer 114, the GaN channel layer 116, the barrier layer 118 and the passivation layer 120 form a stacked layer 122.

It should be noted that in the present embodiment, after the stacked structure 110 is formed, by adjusting process parameters of forming the buffer layer 114, the GaN channel layer 116, the barrier layer 118 and the passivation layer 120, the thicknesses of the buffer layer 114, the GaN channel layer 116, the barrier layer 118 and the passivation layer 120 may be respectively the same with the thicknesses of the buffer layer 102, the GaN channel layer 104, the barrier layer 106 and the passivation layer 108. In other words, the formed stacked structure 110 and the stacked structure 122 substantially have the same structure, and a difference there between is only that the GaN channel layer 104 and the GaN channel layer 116 belong to the channel layers of opposite types, so that process unstableness caused by uneven pattern flatness is avoided in the subsequent process, and it is unnecessary to perform an extra planarization process (for example, a chemical mechanical polishing process).

Figure 1D:
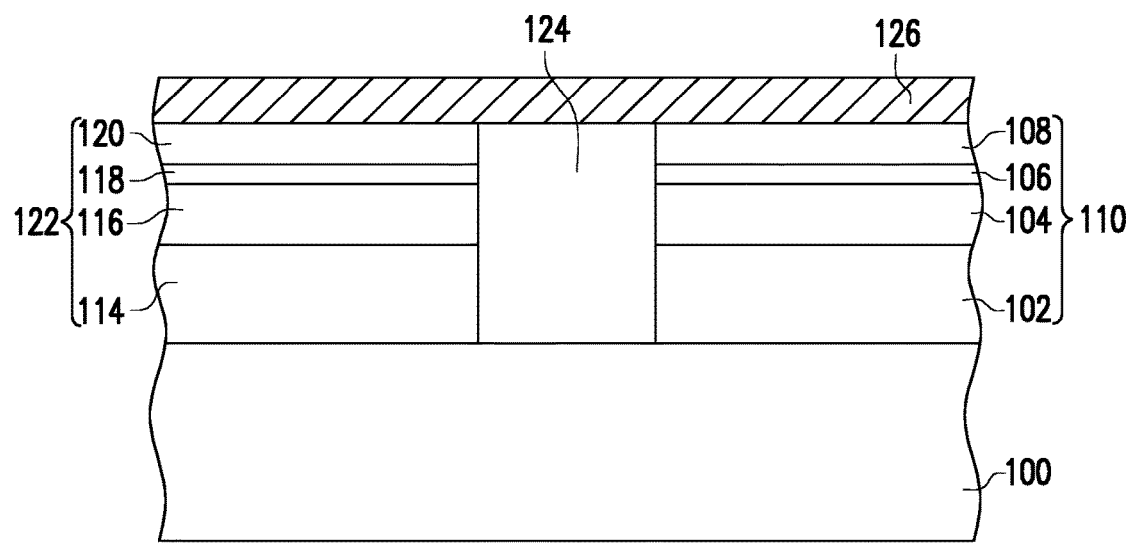

Then, referring to FIG. 1D, the mask layer 112 is removed. During the process of removing the mask layer 112, impurities remained on the mask layer 112 when the buffer layer 114, the GaN channel layer 116, the barrier layer 118 and the passivation layer 120 are formed may be removed altogether. Then, an isolation layer 124 is formed on the substrate 100. A material of the isolation layer 124 is, for example, silicon oxide, silicon nitride, or silicon oxynitride. A method for forming the isolation layer 124 is, for example, to first form an isolation material layer on the substrate 100, where the isolation material layer covers the stacked structure 110 and the stacked structure 122. Then, a planarization process or an etch-back process is performed to remove the isolation material layer on the top surfaces of the stacked structure 110 and the stacked structure 122. In the present embodiment, since the stacked structure 110 and the stacked structure 122 substantially have the same structure, after the planarization process is performed, top surfaces of the stacked structure 110 and the stacked structure 122 are simultaneously exposed, such that the top surface of the stacked structure 110, the top surface of the isolation layer 124 and the top surface of the stacked structure 122 are coplanar, which avails implementation of the subsequent processes.

Figure 2:
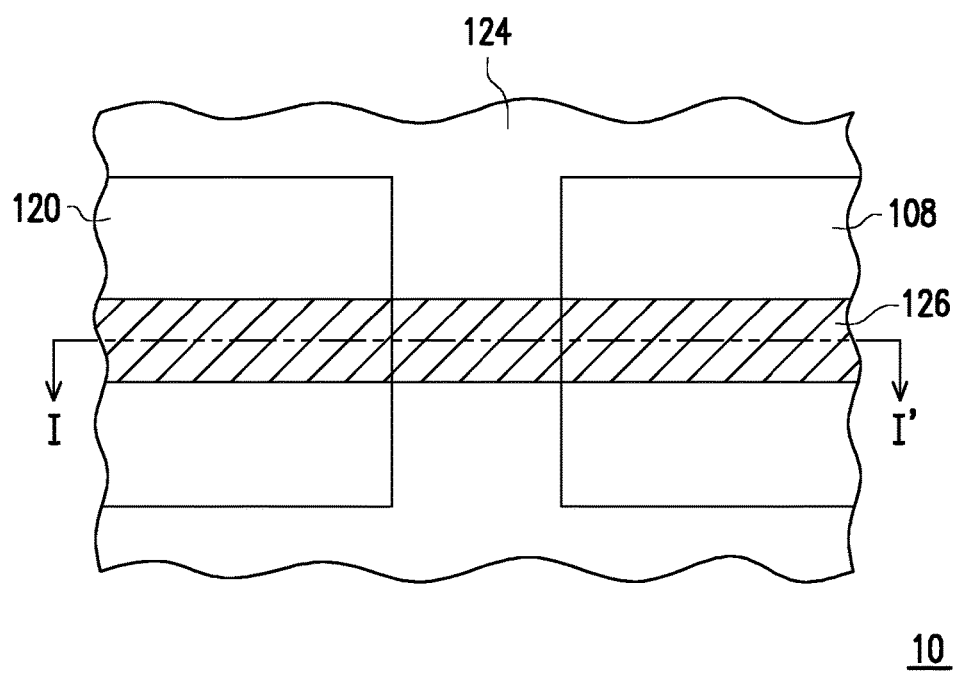
FIG. 2 is a top view of the semiconductor device of the invention.

Then, a gate 126 is formed on the stacked structure 110, the isolation layer 124 and the stacked structure 122 to complete the semiconductor device 10 of the present embodiment. FIG. 2 is a top view of the semiconductor device 10, i.e. FIG. 1D is a cross-sectional view of FIG. 2 along a section line I-I'. As shown in FIG. 1D and FIG. 2, the gate 126 crosses over the isolation layer 124 and is disposed on the stacked structure 110 and the stacked structure 122. In this way, the stacked structure 110 and the gate 126 formed thereon may form a P-type metal oxide semiconductor transistor, and the stacked structure 122 and the gate 126 formed thereon may form an N-type metal oxide semiconductor transistor. Namely, the semiconductor device 10 of the present embodiment is a complementary metal oxide semiconductor (CMOS) transistor including the P-type metal oxide semiconductor transistor and the N-type metal oxide semiconductor transistor.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor device, comprising:
    a first stacked structure, disposed on a substrate, and comprising:
    a first GaN channel layer, disposed on the substrate, and having an N crystal phase; and
    a first barrier layer, disposed on the first GaN channel layer;
    a second stacked structure, disposed on the substrate, and comprising:
    a second GaN channel layer, disposed on the substrate, and having a Ga crystal phase; and
    a second barrier layer, disposed on the second GaN channel layer;
    a first buffer layer, disposed between the first GaN channel layer and the substrate;
    a second buffer layer, disposed between the second GaN channel layer and the substrate;
    an isolation layer, disposed between the first stacked structure and the second stacked structure, wherein a bottom surface of the first buffer layer, a bottom surface of the isolation layer, and a bottom surface of the second buffer layer are coplanar; and
    a gate, disposed on the first stacked structure, the isolation layer and the second stacked structure.

2. The semiconductor device as claimed in claim 1, wherein a thickness of the first GaN channel layer and a thickness of the second GaN channel layer are substantially the same, and a thickness of the first barrier layer and a thickness of the second barrier layer are substantially the same.

3. The semiconductor device as claimed in claim 1, further comprising:
    a first passivation layer and a second passivation layer, wherein the first passivation layer is disposed on the first barrier layer, and the second passivation layer is disposed on the second barrier layer.

4. The semiconductor device as claimed in claim 3, wherein a thickness of the first GaN channel layer and a thickness of the second GaN channel layer are substantially the same, a thickness of the first barrier layer and a thickness of the second barrier layer are substantially the same, and a thickness of the first passivation layer and a thickness of the second passivation layer are substantially the same.

5. The semiconductor device as claimed in claim 1, wherein a thickness of the first GaN channel layer and a thickness of the second GaN channel layer are substantially the same, a thickness of the first barrier layer and a thickness of the second barrier layer are substantially the same, and a thickness of the first buffer layer and a thickness of the second buffer layer are substantially the same.

6. A semiconductor device, comprising:
a first stacked structure, disposed on a substrate, and comprising:
a first GaN channel layer, disposed on the substrate, and belonging to an P-type channel layer; and
a first barrier layer, disposed on the first GaN channel layer;
a second stacked structure, disposed on the substrate, and comprising:
a second GaN channel layer, disposed on the substrate, and belonging to an N-type channel layer; and
a second barrier layer, disposed on the second GaN channel layer;
a first buffer layer, disposed between the first GaN channel layer and the substrate;
a second buffer layer, disposed between the second GaN channel layer and the substrate;
an isolation layer, disposed between the first stacked structure and the second stacked structure, wherein the first stacked structure is isolated from the second stacked structure by the isolation layer, and a bottom surface of the first buffer layer, a bottom surface of the isolation layer, and a bottom surface of the second buffer layer are coplanar; and
a gate, disposed on the first stacked structure, the isolation layer and the second stacked structure.

7. A method for manufacturing a semiconductor device, comprising:
performing a first deposition process to form a first GaN channel layer on a substrate, wherein the first GaN channel layer has an N crystal phase;
forming a first barrier layer on the first GaN channel layer;
removing a part of the first barrier layer and the first GaN channel layer to form a first stacked structure;
performing a second deposition process to form a second GaN channel layer on the substrate, wherein the second GaN channel layer has a Ga crystal phase;
forming a second barrier layer on the second GaN channel layer to form a second stacked structure, wherein the first stacked structure and the second stacked structure are separated;
forming an isolation layer between the first stacked structure and the second stacked structure; and
forming a gate on the first stacked structure, the isolation layer and the second stacked structure, wherein before the step of performing the first deposition process, the method further comprises forming a first buffer layer on the substrate, and after the step of forming the first stacked structure and before the step of performing the second deposition process, the method further comprises forming a second buffer layer on the substrate.

8. The method for manufacturing the semiconductor device as claimed in claim 7, wherein the first deposition process is different from the second deposition process.

9. The method for manufacturing the semiconductor device as claimed in claim 7, wherein a thickness of the first GaN channel layer and a thickness of the second GaN channel layer are substantially the same, and a thickness of the first barrier layer and a thickness of the second barrier layer are substantially the same.

10. The method for manufacturing the semiconductor device as claimed in claim 7, wherein after the step of forming the first barrier layer and before the step of removing a part of the first barrier layer and the first GaN channel layer, the method further comprises forming a first passivation layer on the first barrier layer, and after the step of forming the second barrier layer and before the step of forming the isolation layer, the method further comprises forming a second passivation layer on the second barrier layer.

11. The method for manufacturing the semiconductor device as claimed in claim 10, wherein a thickness of the first GaN channel layer and a thickness of the second GaN channel layer are substantially the same, a thickness of the first barrier layer and a thickness of the second barrier layer are substantially the same, and a thickness of the first passivation layer and a thickness of the second passivation layer are substantially the same.

12. The method for manufacturing the semiconductor device as claimed in claim 7, wherein a thickness of the first GaN channel layer and a thickness of the second GaN channel layer are substantially the same, a thickness of the first barrier layer and a thickness of the second barrier layer are substantially the same, and a thickness of the first buffer layer and a thickness of the second buffer layer are substantially the same.

13. The method for manufacturing the semiconductor device as claimed in claim 7, wherein after the step of forming the first stacked structure and before the step of performing the second deposition process, the method further comprises forming a mask layer on the substrate to cover the first stacked structure, and after the step of forming the second stacked structure and forming the isolation layer, the method further comprises removing the mask layer.

* * * * *